US 6,716,060 B2

(12) United States Patent
Gollhofer et al.

(10) Patent No.: US 6,716,060 B2
(45) Date of Patent: Apr. 6, 2004

(54) ELECTRICAL CONNECTOR WITH SOLDER PLATE AND PEGS FOR PC BOARD MOUNTING

(75) Inventors: Martin Gollhofer, Fellbach (DE); Roland Etzkom, Kernen (DE); Wolfgang Zeeb, Remshalden (DE); Wolfgang Hutt, Weinstadt (DE); Michael Stache, Weinstadt (DE)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 0 days.

(21) Appl. No.: 10/213,871

(22) Filed: Aug. 6, 2002

(65) Prior Publication Data

US 2003/0040218 A1 Feb. 27, 2003

(30) Foreign Application Priority Data

Aug. 22, 2001 (DE) ..................................... 201 13 884 U

(51) Int. Cl.⁷ ..................... H01R 13/66; H01R 13/73; H01R 13/60; H02B 1/01
(52) U.S. Cl. .................... 439/567; 439/544; 439/569
(58) Field of Search ................. 439/567, 555, 439/569, 532, 544, 550, 553, 557

(56) References Cited

U.S. PATENT DOCUMENTS

| 4,422,701 | A | * | 12/1983 | Anderson | 439/107 |
| 4,508,418 | A | * | 4/1985 | Gagne | 439/827 |
| 5,816,855 | A | * | 10/1998 | Pesson | 439/567 |
| 6,033,241 | A | * | 3/2000 | Iwata et al. | 439/157 |
| 6,250,964 | B1 | * | 6/2001 | Fair et al. | 439/607 |

FOREIGN PATENT DOCUMENTS

| EP | 0851540 A2 | 7/1998 |
| EP | 0930812 A2 | 7/1999 |
| WO | WO 01/37379 A1 | 5/2001 |

* cited by examiner

Primary Examiner—Chandrika Prasad
(74) Attorney, Agent, or Firm—Roger C. Turner

(57) ABSTRACT

An electrical connector is constructed for ease of fixing a sheet metal solder plate (25) to the bottom surface portion (70) of the connector insulator frame (12), so the solder plate can be soldered to one or more traces on a circuit board to hold down the frame. The frame has downwardly extending pegs (33–35) and the solder plate has corresponding peg-receiving holes (28–30). The mount plate forms at least one tongue (48, 49) at each of its holes, each tongue projecting against one of the pegs to form an interference fit against the peg that prevents removable of the solder plate from the insulator pegs. Each peg has a vertical slot (38, 39) that receives a nose (50, 51) at the end of the tongue.

12 Claims, 3 Drawing Sheets

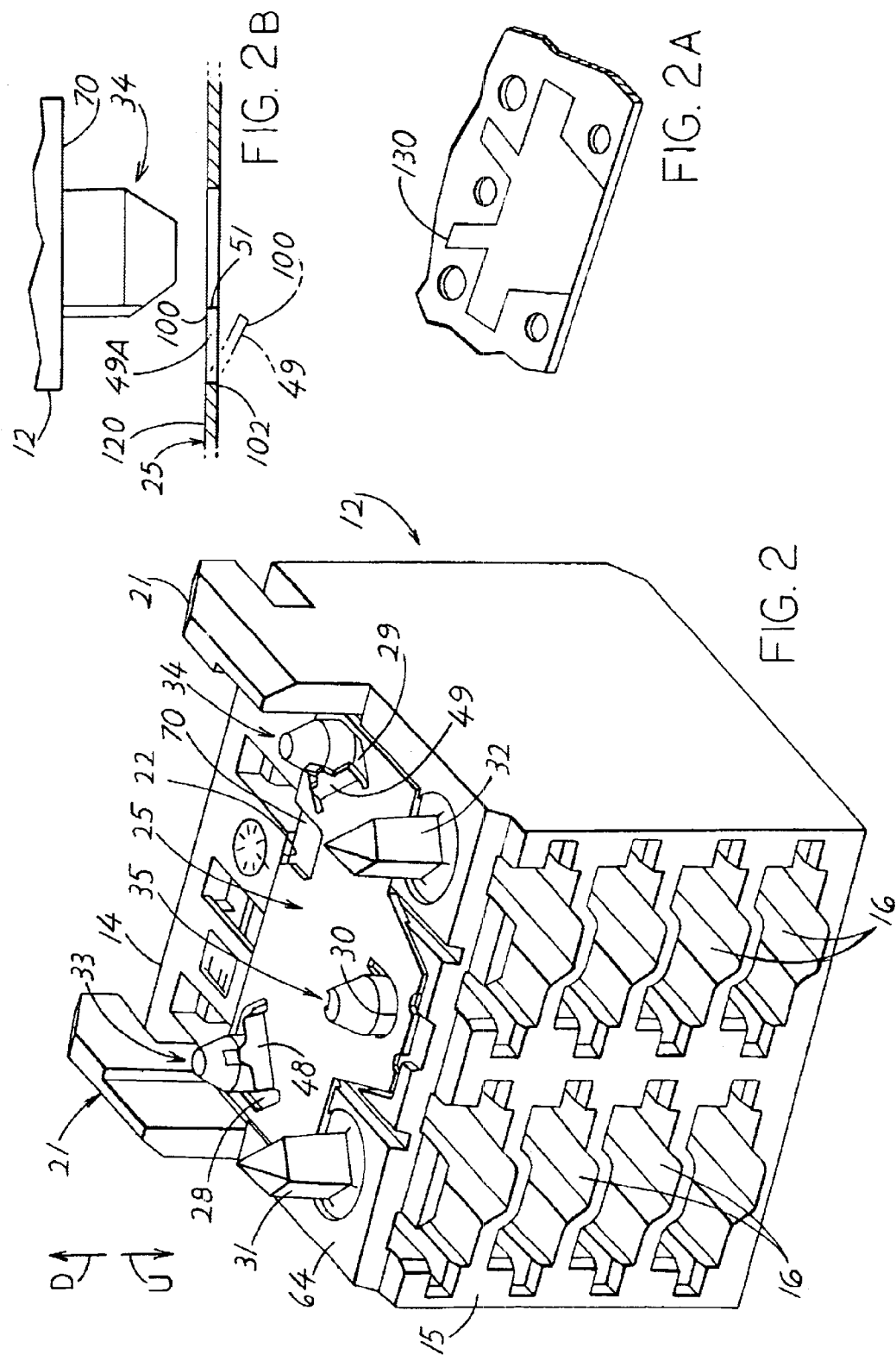

ELECTRICAL CONNECTOR WITH SOLDER PLATE AND PEGS FOR PC BOARD MOUNTING

CROSS-REFERENCE TO RELATED APPLICATION

Applicant claims priority from German patent application 20113884.0 filed Aug. 22, 2001.

BACKGROUND OF THE INVENTION

A connector that mounts on a circuit board can include an insulative frame with passages that hold contacts with tails to be soldered to traces on the circuit board. The frame can be held down to the board by fixing a sheet metal solder plate to the bottom of the frame and soldering the solder plate to one or more traces on the circuit board.

Low cost manufacture requires that the solder plate be easily fixed to the lower end of the insulator. One method, described in European patent application EP 0 930 812 A2 includes molding the frame with downwardly projecting pegs and forming the sheet metal solder plate with corresponding holes. The pegs are projected through the holes and the peg lower ends are deformed by the application of heat and pressure to produce hot riveting. Such hot riveting is difficult, requires a separate a manufacturing step, and requires appropriate equipment. It would be desirable if the solder plate could be more easily attached to the insulator, while still assuring a reliable attachment.

SUMMARY OF THE INVENTION

In accordance with one embodiment of the present invention, a solder plate is provided that can be soldered to a circuit board to hold an electrical connector frame to the board, wherein the connector frame and solder plate are constructed for ease of fixing the solder plate to the frame. The insulative connector frame has a plurality of pegs depending from a lower surface portion thereof, and the solder plate has a plurality of corresponding peg-receiving holes. The solder plate forms at least one projection at each of the peg-receiving holes. When a peg is forced through one of the holes, the projection presses against the peg to form an interference fit between the peg and the walls of the hole that prevent removal of the solder plate from the frame. Each projection is bent downwardly by a corresponding peg moving downwardly through the hole, with the projection extending at a downward incline from a major portion of the solder plate to the peg, so the free end of the projection can dig into the peg if the peg starts to move upward out of the hole.

Each peg has a vertical slot, and a corresponding projection has a free outer end with a nose that projects partially into the slot. This allows the slot to prevent the projection from being bent sidewardly. Each hole in the solder plate has a concave side opposite the projection, the concave side partially encircling the peg. The solder plate has corners, and the concave side of a hole lies closest to the corner of the plate.

The novel features of the invention are set forth with particularity in the appended claims. The invention will be best understood from the following description when read in conjunction with the accompanying drawings.

BRIEF DESCRIPTION OF THE DRAWINGS

FIG. 2 is a bottom isometric view, taken along arrow II of FIG. 1, showing only the insulative frame and solder plate of the connector, but not the contacts.

FIG. 2A is a partial isometric view of the upper face of the circuit board of FIG. 1, showing one possible mount trace arrangement.

FIG. 2B is an exploded view showing one of the mount pegs and a portion of the solder plate of FIG. 2, and showing, in phantom lines, a tongue after it had been downwardly bent by the peg.

DESCRIPTION OF THE PREFERRED EMBODIMENTS

Figure 1:
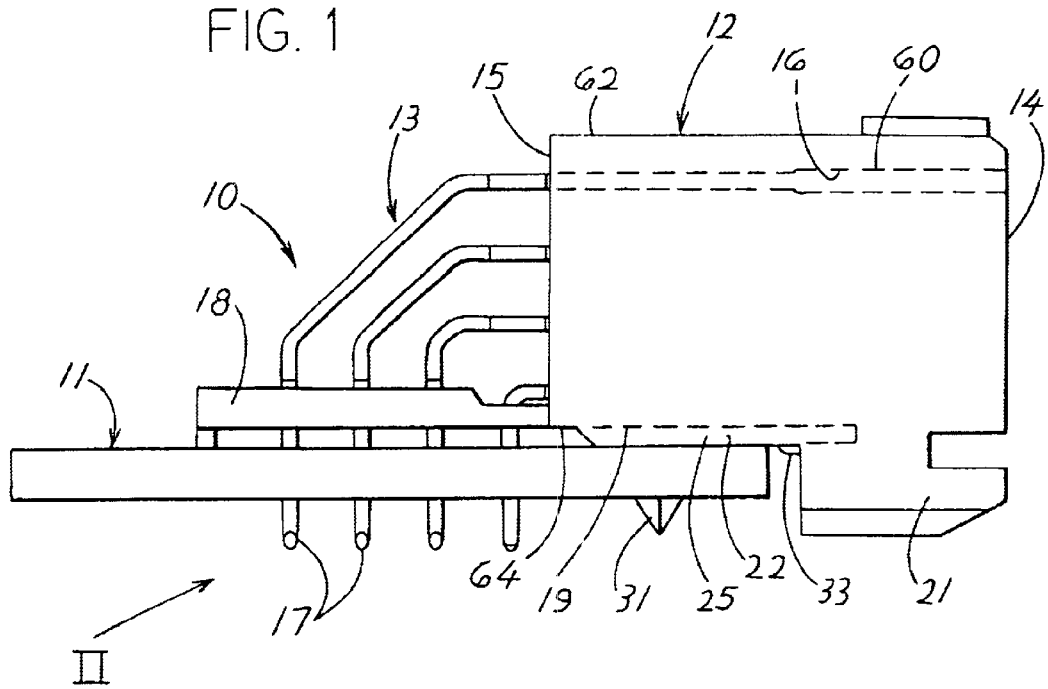
FIG. 1 is a side elevation view of a connector of the present invention, shown mounted on a circuit board.

FIG. 1 illustrates an electrical connector 10 designed to be mounted on a circuit board 11. The connector has an electrically insulative frame 12 with multiple passages 16 that each holds a portion of an electrical contact 13. Each contact has a mating end 60 which may be of the pin or socket type, and has tails 17 extending perpendicular to the mating ends and which are held by a perforated holding plate 18. The tails 17 project into plated holes of the circuit board, to which they are soldered.

The insulative frame 12 has front and rear ends 14, 15 and upper and lower ends 62, 64. Slotted wings 21 that lie forward of the circuit board, aid in connection to a mating connector. Positioning pins such as 31 project through corresponding holes in the circuit board to hold the connector to the board.

FIG. 2 shows the connector with the downward D and upward U directions being upside down, so the insulative frame lower end 64 is uppermost. The connector includes a solder plate, or solder board 25 mounted at the lower end of the frame 12. The frame has a depression or recess 22 of slightly greater thickness than the solder board 25, and the solder board lies in the recess. Two positioning pins 31, 32 project downwardly, or depend from the frame. Three mount pegs 33, 34, 35 depend from a plate-adjacent lower surface portion 70 of the frame that lies at the top of the recess 22, and that the solder plate lies against. The solder plate has three holes, 28, 29, 30 for receiving the mounting pegs 33, 34, 35. All pegs 31–35 are molded integrally with the rest of the insulative frame 12.

Figure 3:
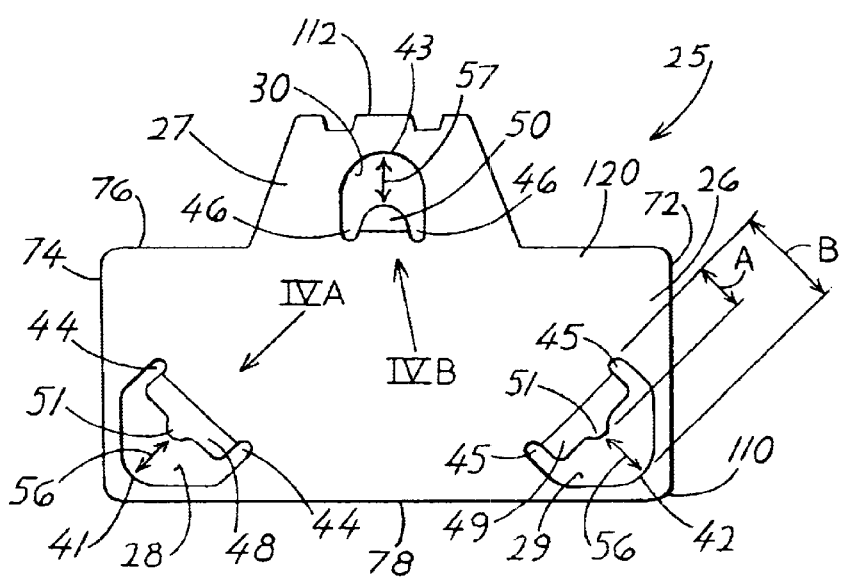
FIG. 3 is a plan view of only the solder plate prior to its mounting on the connector frame.

FIG. 3 shows the shape of the solder plate 25, which includes a rectangular base portion 26 and a trapezoid extension 27. The rectangular part 26 has two shorter edges 72, 74 and two longer edges 76, 78. The trapezoid extension 27 extends from one of the long edges 76. One of the peg-receiving holes 30 lies in the trapezoid extension while two other holes 28, 29 lie adjacent to a long edge 78 that lies opposite the hole 30.

Figure 4A:
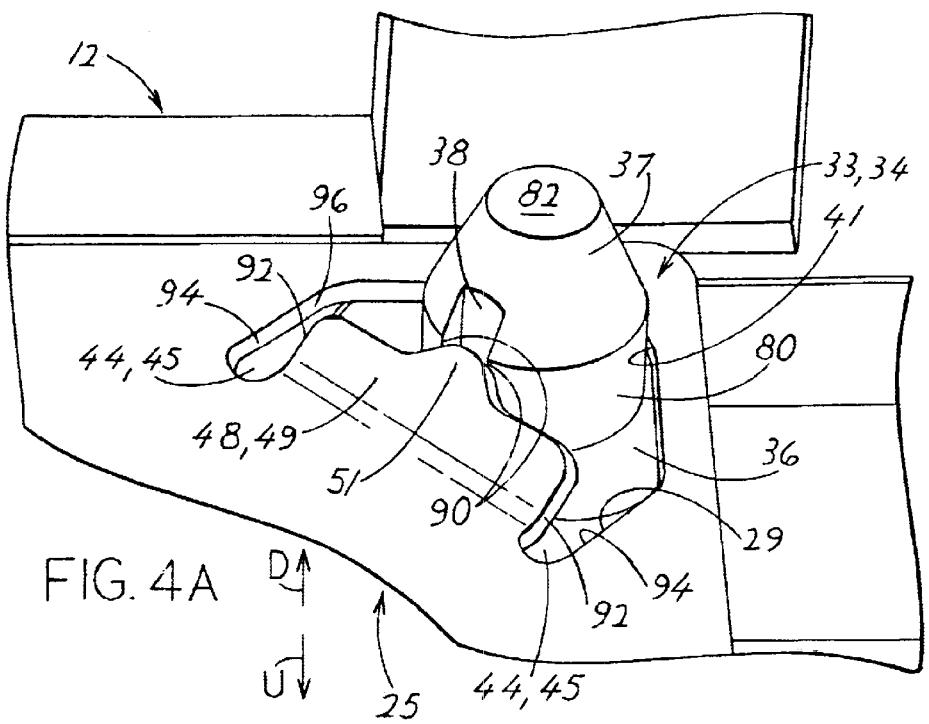
FIG. 4A is an enlarged bottom isometric view of one of the pegs and a portion of the mount plate, as seen along arrow IVA of FIG. 3.
Figure 4B:
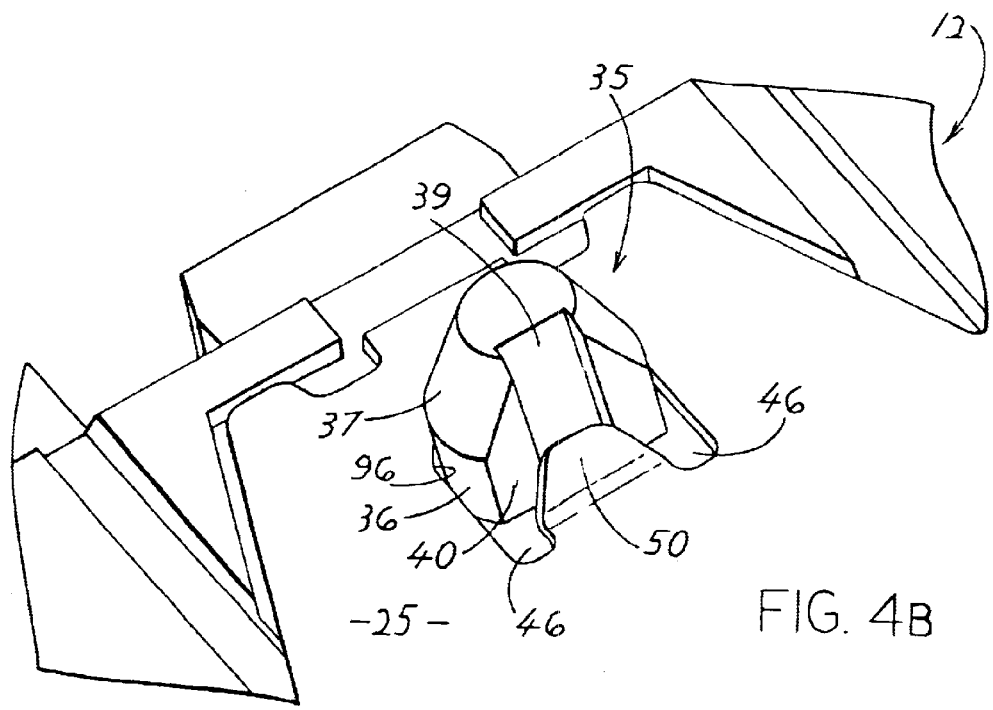
FIG. 4B is a bottom isometric view of another one of the pegs in a portion of the solder plate, as seen along arrow IVB in FIG. 3.

As shown in FIG. 4A, the peg 34 has a base 36, a largely cylindrical part 80 extending downwardly from the base 36, and a conical lower portion 37 with a flat bottom 82. Each peg also has a primarily vertical groove or slot 38, at one side. FIG. 3 shows that each of the two solder plate holes 28, 29 has a concave side 41, 42 and has a projection in the form of a tongue 48, 49 lying primarily opposite the corresponding concave side 41, 42. Each concave side 41, 42 partially surrounds a peg. Each tongue is resiliently deflectable and has a nose 51 that can enter partially into the vertical slot in the corresponding peg. FIG. 4A shows the nose 51 entering partially into the vertical slot 38 and pressing against opposite slot edges 90 of the peg middle portion 80 while pressing the opposite side of the peg against the concave side 41 of the solder plate hole. The pressing of the peg 34 against the tongue and concave side of the hole constitutes an interference fit.

In order to assure at least partial resilience of the tongue such as 49, the walls of the hole 29 in the solder plate are formed with cutout regions 44, 45. The cutout regions form largely parallel edges 92, 94 on each of the tongue opposite sides and on walls of the hole opposite the tongue sides. The edges 94 extend to opposite ends 96 of the concave side 41. The cutout results in a tongue that can be at least partially resiliently deflected. Each tongue has a length A that is preferably at least 25% of the distance B across the hole.

FIG. 2B shows a tongue 49A prior to its deflection by a peg 34, and shows the tongue 49 after its further downward deflection after the peg 34 has been installed. The tongue has a free end 100 that forms the nose 51 and has an opposite inner end 102 merging with a major portion 120 of the solder plate. The tongue extends at a downward incline from its inner end 102 to its free outer end 100, especially after the peg has been installed. This results in the tongue free end 100 biting into the peg if the solder plate 25 should be moved downwardly with respect to the insulative frame 12. The tongue 49A can be left to lie in the plane of the rest of the solder plate prior to peg insertion, or can be bent slightly downward prior to peg insertion.

FIG. 3 shows that the two holes 28, 29 at the front end of the rectangular portion of the plate are identical. The other hole 30 in the projecting portion 27 of the plate is narrower, its concave side 43 extends further closely around the peg, and its tongue 50 is narrower. However, the action is the same compared to the other holes and the corresponding pegs.

The edges 72, 74, 78 of the rectangular plate portion form a pair of corners 110 opposite the extension. The concave sides 41, 42 of the hole walls lie adjacent to the corners while the tongues 48, 49 lie opposite the corners and project towards the corners. This enables the pegs to lie as far apart as possible for a solder plate of given width. The extension 27 of the plate does not have a defined corner, so the concave side 43 lies adjacent to an edge 112 of the projection, with the tongue 50 projecting towards the edge 112.

The manufacturer of the insulative frame 12 molds it in an injection mold, with the pegs formed at the same time as the rest of the frame. The solder plate 25 is formed by punching out the plate from a piece of sheet metal, with the holes punched out at the same time. The solder plate is installed by pressing it into place with a tool that applies forces at locations adjacent to the three holes. Once the solder plate has been installed, it cannot be economically removed. The lower surface of the solder plate or the mounting traces it solders to, can be coated with a mixture of solder particles and solder flux, so after the connector is physically placed on the circuit board (with its contact tails lying in the corresponding holes) soldering can be achieved by vapor phase soldering or other means.

While terms such as "up", "down", etc. has been used to help describe the invention as it is illustrated, it should be understood that the connector can be used in any orientation with respect to the Earth.

Thus, the invention provides a connector of the type that has an insulative frame with depending pegs at its lower end that extend through holes in a solder plate that is used to hold the connector to a circuit board by soldering to traces thereon, which facilitates installing the solder plate on the pegs. The peg-receiving holes of the solder plate form at least one projection at each hole, the projections pressing against a peg that has been inserted through the hole to form an interference fit between the walls of the hole and the peg. The projection is preferably in the form of a resilient tongue that bends to extend at a downward incline when the peg has been installed, so an outer edge of the tongue can bite into the peg if the peg begins to be pulled out of a hole. It is possible to use a projection that has a very small length and which scraps against the peg as the peg is installed, but applicant prefers a longer tongue. The peg is preferably formed with a vertical slot, and the tongues have free outer ends with convex noses that project at least partially into the slots, thereby avoiding sideward twisting of the tongue. Each hole in the solder plate has a concave side that partially surrounds the peg and a largely opposite side that forms the tongue. At least one of the holes is oriented with the concave side of the hole adjacent to a corner of the solder plate.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. An electrical connector for mounting on the upper face of a circuit board that has a mount trace, said connector including an insulative frame with upper and lower ends and a plurality of contacts mounted in said frame, said frame lower end having a plate-adjacent lower surface portion and a plurality of plate mount pegs depending therefrom and integral with the rest of the frame, and said connector including a sheet metal solder plate having an upper face lying facewise adjacent to said plate-adjacent surface portion, said solder plate constructed to be solderable to the mount trace on the circuit board and said solder plate having a plurality of peg-receiving holes, with each of said mount pegs projecting through one of said peg-receiving holes, wherein:

said solder plate has a cutout portion at each of said plate holes that forms at least one projection at each of said plate holes, each projection projecting against one of said pegs that projects through the hole to form an interference fit against the peg that prevents the solder plate from moving down away from said plate-adjacent surface.

2. The connector described in claim 1 wherein:

said solder plate has a major portion lying in a first plane;

said projection comprises a tongue at each of said plate holes, each tongue being bent downwardly by a corresponding peg moving downwardly through the hole, so the tongue extends at a downward incline from said major portion to the peg.

3. The connector described in claim 2 wherein:

said solder plate has a plurality of edges joined by corresponding plate corners;

at least a first of said plate holes lies adjacent to a first of said plate corners;

the tongue of said first plate hole projects from a side of said first plate hole that is opposite said first plate corner.

4. The connector described in claim 2 wherein:

said major portion has a first edge and said solder plate has an extension extending from said first edge, said extension having an extension edge and having an extension hole;

the tongue at said extension hole projects from a side of said extension hole that is opposite said extension edge.

5. The connector described in claim 1 wherein:

at least one of said pegs has a vertical slot, the slot extending to the peg lower end and the corresponding tongue has an inner end that merges with the plate major portion and an outer end with a nose that projects partially into the slot, whereby to stabilize the position of the projection.

6. The connector described in claim 1 wherein:

said holes each have concave first sides against which a peg nests;

said projection comprises a tongue that extends from a side of said hole opposite said first side and partially across the corresponding plate hole.

7. The connector described in claim 1 wherein:

each of said cutout portions forms a pair of cutout regions on opposite sides of one of said projections, each cutout region (44, 45) having primarily parallel edges (92, 94).

8. An electrical connector for mounting on a circuit board, said connector including an insulative frame with a lower end that forms a plate-adjacent lower surface and with a plurality of plate mount pegs that project downwardly below said lower surface portion, said connector including a sheet metal solder plate with a plurality of holes that each receives one of said pegs, wherein:

said solder plate forms each of said mount holes with mount hole walls that each has a concave side that closely partially surrounds a corresponding peg so the peg nests in the concave side, and that each has a tongue with an outer end that presses the peg against the concave side, each tongue having an inner end lying opposite its outer end, and each tongue being bent so its outer end lies below its inner end.

9. The connector described in claim 8 wherein:

each of said pegs has a vertical slot with opposite slot sides, and each of said tongue outer ends forms a rounded nose that projects into a corresponding one of said peg slots and engages said opposite slot edges.

10. The connector described in claim 8 wherein:

said solder plate has a plurality of corners;

each of a plurality of said holes lies adjacent to one of said corners, with the concave side of the hole closest to the corner and the tongue projecting toward the corner.

11. A method for use with a connector that includes an insulative frame having a lower surface with a plate-adjacent lower surface portion and a plurality of pegs that depend from the lower surface portion, to form a sheet metal solder plate and hold it to the lower surface portion by use of the pegs depending from the lower surface, comprising:

punching out regions in the solder plate to leave mount holes that each includes a concave side for lying against and partially around one side of a peg, and that each includes a tongue lying opposite said concave side and having an inner end and having an outer end projecting into the mount hole;

pressing said solder plate upward toward said lower surface portion, including aligning said pegs with said mount holes and deflecting said tongue outer ends in a downward direction with respect to said lower surface portion as the mount plate moves toward said lower surface portion;

leaving said solder plate with said tongues pressing said pegs against said concave sides of said mount holes.

12. The method described in claim 11 wherein said pegs have vertical grooves, and wherein:

said peg grooves have open lower ends.

\* \* \* \* \*